(12) United States Patent
Enchi et al.

(10) Patent No.: US 7,423,884 B2
(45) Date of Patent: Sep. 9, 2008

(54) MULTILAYER CIRCUIT BOARD

(75) Inventors: Kouhei Enchi, Osaka (JP); Yoji Ueda, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 378 days.

(21) Appl. No.: 11/079,373

(22) Filed: Mar. 14, 2005

(65) Prior Publication Data

US 2006/0081397 A1    Apr. 20, 2006

(30) Foreign Application Priority Data

Mar. 17, 2004    (JP) .............................. 2004-077001

(51) Int. Cl.
*H05K 1/18* (2006.01)
(52) U.S. Cl. ....................... 361/761; 361/748; 361/760; 361/793; 336/199; 336/200
(58) Field of Classification Search ................. 336/199, 336/200; 361/760, 782, 761, 779, 790–795
See application file for complete search history.

(56) References Cited

U.S. PATENT DOCUMENTS

| 5,373,276 | A | * | 12/1994 | Suppelsa et al. ............... 336/65 |
| 5,572,180 | A | * | 11/1996 | Huang et al. ................. 336/200 |
| 6,011,330 | A | * | 1/2000 | Goodman et al. ............ 307/150 |
| 2002/0057174 | A1 | * | 5/2002 | Uchikoba et al. ............ 336/200 |
| 2005/0174208 | A1 | * | 8/2005 | Sato et al. .................... 336/200 |
| 2006/0109071 | A1 | * | 5/2006 | Thongsouk et al. ......... 336/200 |
| 2006/0145805 | A1 | * | 7/2006 | Kim et al. .................... 336/200 |
| 2007/0001795 | A1 | * | 1/2007 | Brandt et al. ................ 336/200 |
| 2007/0085648 | A1 | * | 4/2007 | Lee et al. ..................... 336/200 |
| 2007/0090912 | A1 | * | 4/2007 | Lee ............................... 336/200 |

FOREIGN PATENT DOCUMENTS

| JP | 2000-223316 A | 8/2000 |
| JP | 2001-77538 A | 3/2001 |

* cited by examiner

*Primary Examiner*—Dean A. Reichard
*Assistant Examiner*—Hoa C Nguyen
(74) *Attorney, Agent, or Firm*—Hamre, Schumann, Mueller & Larson, P.C.

(57) ABSTRACT

A multilayer circuit board includes: two or more layers of electrical insulative base members; and two or more layers of conductive patterned layers. At least two of the conductive patterned layers include coil patterns that will be a part of a coil, through holes are provided at predetermined positions of the electrical insulative base members, the positions being sandwiched between the coil patterns, so as to enable communication between respective end portions of the coil patterns, and conductive paste charged in the through holes allows electrical connection to be established between the respective end portions. The coil is formed so as to be wound in a direction perpendicular to a thickness direction of the multilayer circuit board. With this configuration, a multilayer circuit board can be provided, which facilitates increasing the winding number of a coil and has excellent flexibility of circuit design.

11 Claims, 14 Drawing Sheets

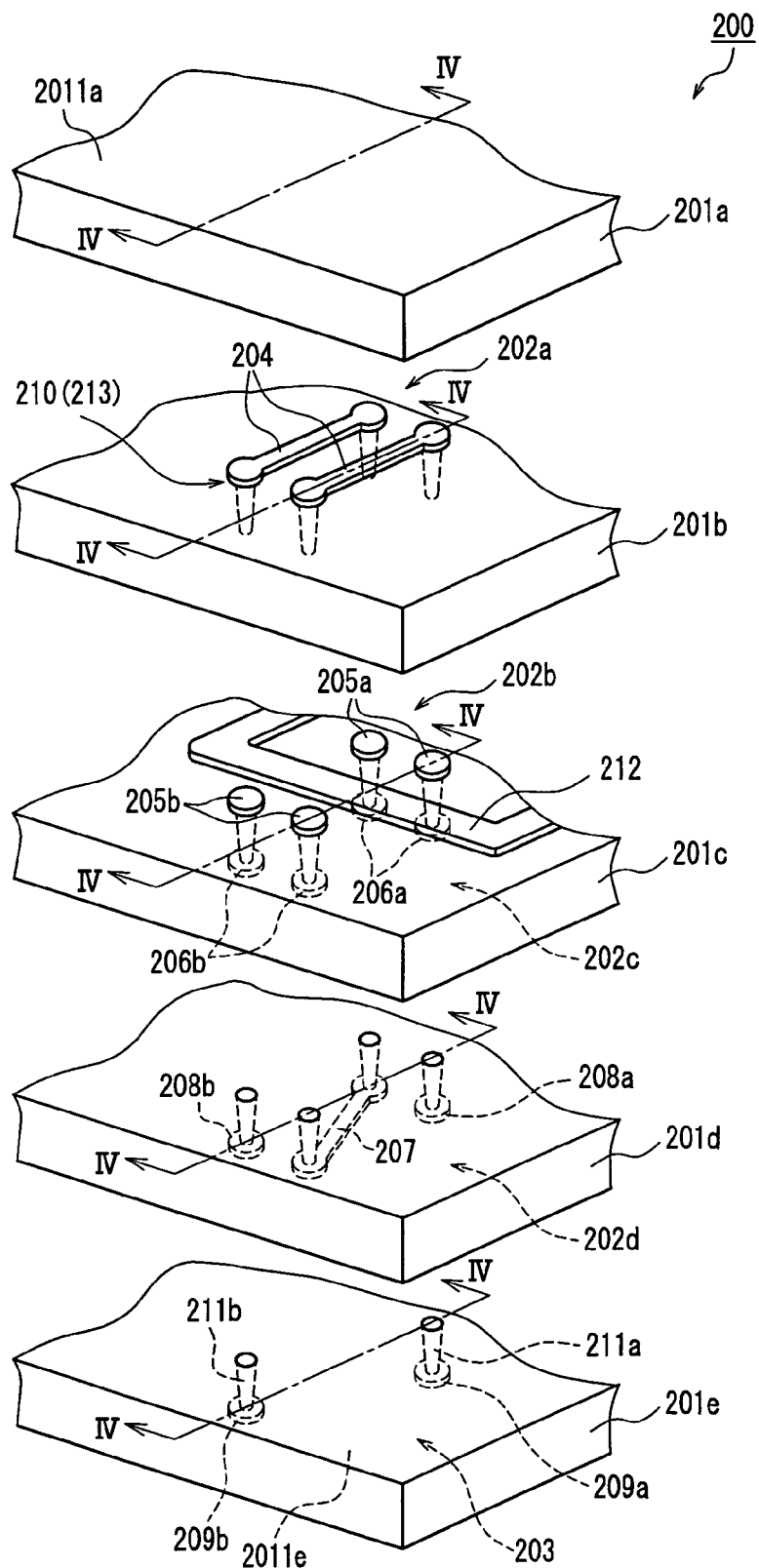
F I G. 5A

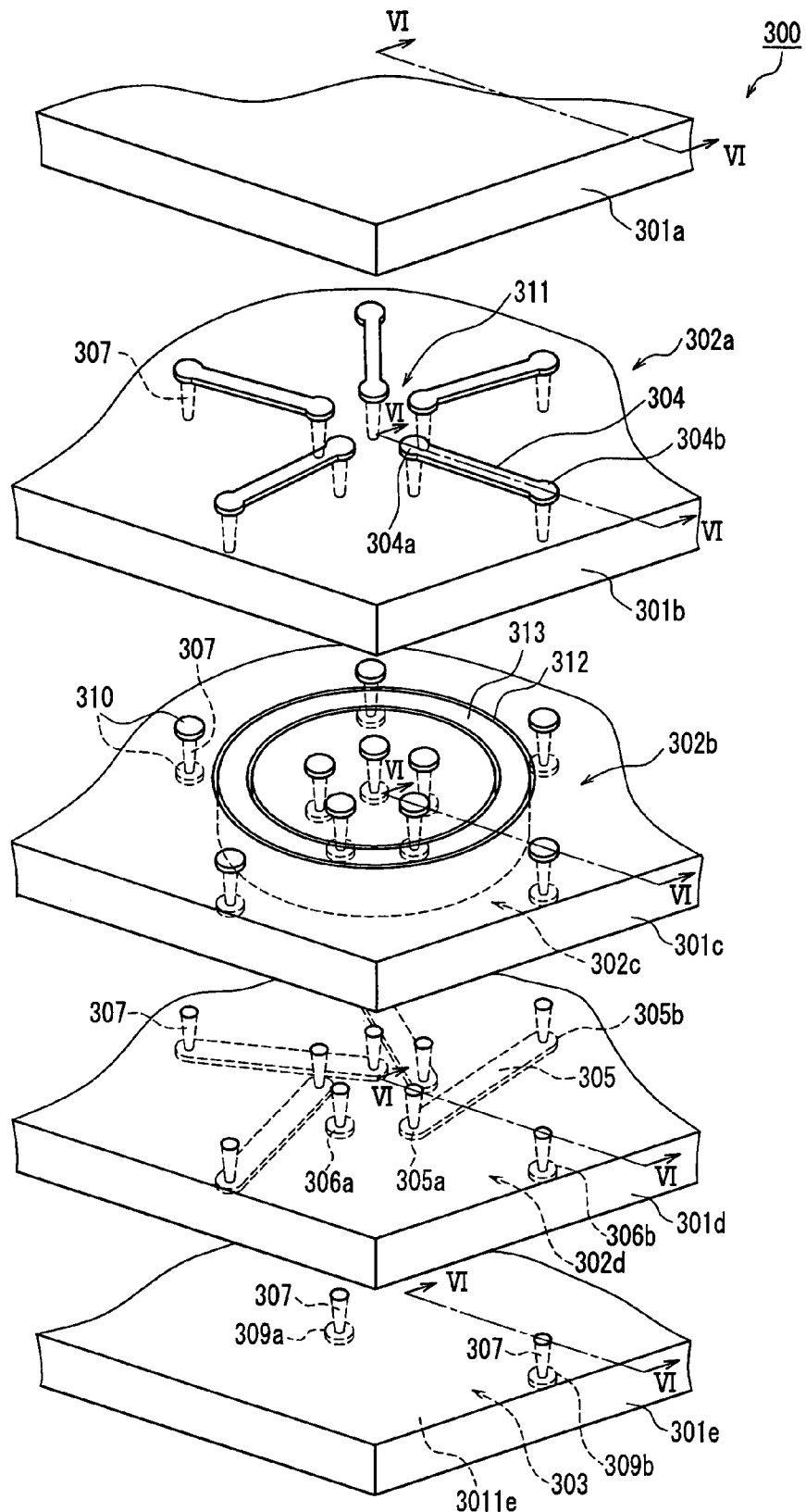
F I G. 7A

MULTILAYER CIRCUIT BOARD

FIELD OF THE INVENTION

The present invention relates to a multilayer circuit board including a coil.

BACKGROUND OF THE INVENTION

As conventionally known methods for forming a coil, there is a method of forming a plurality of coil patterns, each of which will be a part of a coil, in a circuit board and then connecting these coil patterns electrically so as to form a coil. For instance, as shown in FIG. 9, JP 2001-77538A suggests that coil patterns 402a to 402d shaped like a letter C are formed on principal surfaces of respective layers 401a to 401c of a build-up multilayer board 400, and the coil patterns 402a to 402d are connected via build-up vias 403a to 403c so as to form a circuit board including a patterned coil with a spiral shape as a whole.

Furthermore, as shown in FIG. 10, JP 2000-223316A suggests a circuit board having a coil structure formed as follows: a plurality of coil patterns 501 and 502 are formed to be aligned on upper and lower surfaces 500a and 500b of a board 500, and end portions 501a and 502a of the respective coil patterns 501 and 502, provided backward (upper right side) of this drawing, are connected electrically with each other via a plurality of conductive portions 503a formed to penetrate the board 500. Similarly, end portions 501b and 502b of the respective coil patterns 501 and 502, provided forward (lower left side) of this drawing, are connected electrically with each other via a plurality of conductive portions 503b formed to penetrate the board 500.

According to these circuit boards, there is no need for separately mounting a coil on the circuit board, thus enhancing the working efficiency during the manufacturing of a circuit.

However, for the patterned coil described in JP 2001-77538A, the coil patterns are provided on principal surfaces of the respective layers of the board. Therefore, in order to increase the winding number of the coil, the number of layers of the board has to be increased. Although the winding number of the coil has to be increased for obtaining a larger inductance, the winding number of the above-mentioned patterned coil is restricted to the number of the layers of the board as described above. Therefore, if an inductance larger than a predetermined threshold value is required, it may be difficult to increase the winding number. Also, when the number of the layers of the board is increased for obtaining a larger inductance, displacement in the lamination may occur. In an extreme case, the connection of build-up vias with coil patterns formed between the layers may become unstable, resulting in electrical discontinuity.

On the other hand, the coil structure described in JP 2000-223316A is wound in the direction perpendicular to the thickness direction of the board, and therefore the winding number of the coil can be increased in this winding direction. However, since the board is a so-called double-sided circuit board including a single layer of an electrical insulative base member and conductive patterned layers formed on both principal surfaces of this electrical insulative base member, there is a possibility of lowering the flexibility of circuit design. For instance, since a single-winding coil only can be provided in the thickness direction of the board, if an inductance larger than a predetermined threshold value is required, it may be difficult to increase the winding number. Further, there is a possibility of the failure to provide members having various functions, which will described later, including a shielding function, a current detection function and the like, separately.

SUMMARY OF THE INVENTION

In order to cope with the above-stated problems, it is an object of the present invention to provide a multilayer circuit board that facilitates increasing the winding number of a coil and has excellent flexibility of circuit design.

The multilayer circuit board of the present invention includes: two or more layers of electrical insulative base members; and two or more layers of conductive patterned layers. Each of the conductive patterned layer is disposed on at least one selected from: an outer surface of one of the electrical insulative base members that is an outermost layer; and an interface between the respective electrical insulative base members. At least two of the conductive patterned layers include coil patterns that will be a part of a coil. Through holes are provided at predetermined positions of the electrical insulative base members, the positions being sandwiched between the coil patterns, so as to enable communication between respective end portions of the coil patterns. Conductive paste charged in the through holes allows electrical connection to be established between the respective end portions, whereby the coil is formed so as to be wound in a direction perpendicular to a thickness direction of the multilayer circuit board.

BRIEF DESCRIPTION OF THE DRAWINGS

FIG. 5A is a perspective view of a multilayer circuit board according to Embodiment 5 of the present invention, showing each layer separately.

FIG. 7A is a perspective view of a multilayer circuit board according to Embodiment 7 of the present invention, showing each layer separately.

DETAILED DESCRIPTION OF THE INVENTION

Figure 1A:
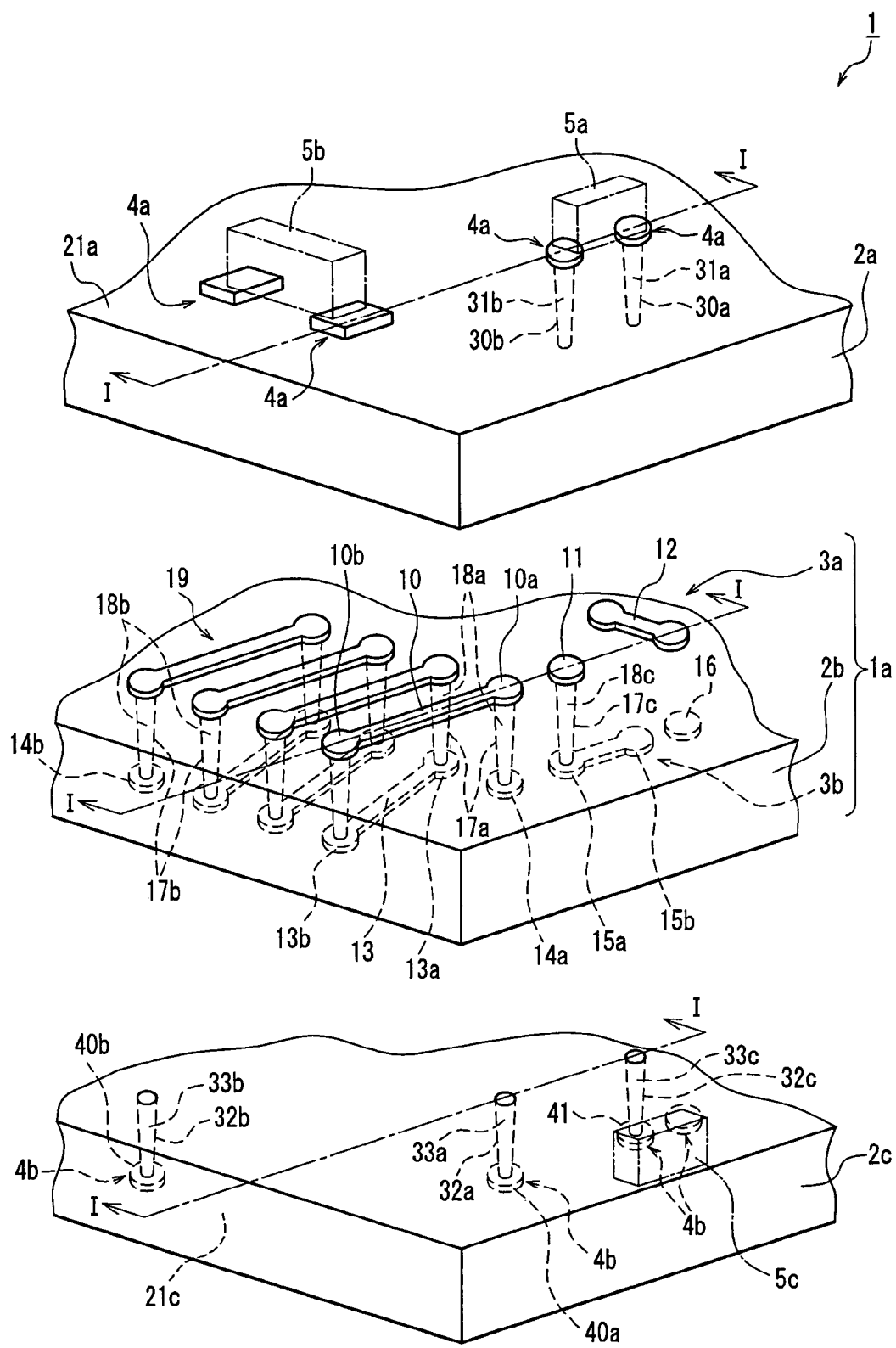
FIG. 1A is a perspective view of a multilayer circuit board according to Embodiment 1 of the present invention, showing each layer separately.

The multilayer circuit board of the present invention (hereinafter, also simply referred to as a "board") may include: two or more layers of electrical insulative base members; and two or more layers of conductive patterned layers. Each of the conductive patterned layer may be disposed on at least one selected from: an outer surface of one of the electrical insulative base members that is an outermost layer; and an interface between the respective electrical insulative base members.

As the electrical insulative base members, a member containing: 20 weight % to 70 weight %, inclusive, of an aramid non-woven cloth or a glass non-woven cloth; and 30 weight % to 80 weight %, inclusive, of a thermosetting resin can be used. The thermosetting resin preferably includes at least one selected from the group consisting of an epoxy resin, an aramid epoxy resin, a phenol resin and a cyanate resin. The conductive patterned layers can be formed by a well-known method, for example, which can be obtained by patterning a metal foil such as copper foil by a photolithographic method.

Further, according to the multilayer circuit board of the present invention, at least two of the conductive patterned layers may include coil patterns that will be a part of a coil, through holes may be provided at predetermined positions of the electrical insulative base members, the positions being sandwiched between the coil patterns, so as to enable communication between respective end portions of the coil patterns, and conductive paste charged in the through holes may allow electrical connection to be established between the respective end portions. With this configuration, a conductive portion made of the conductive paste is formed in the through hole, and a coil conductor including this conductive portion and the coil pattern is formed. Then, the coil conductors corresponding to the winding number of the coil in number are connected, whereby a coil is formed so as to be wound in a direction perpendicular to a thickness direction of the board.

In this way, according to the multilayer circuit board of the present invention, a coil is formed so as to be wound in a direction perpendicular to a thickness direction of the multilayer circuit board. Therefore, the winding number of the coil can be increased easily in this winding direction.

Further, since the multilayer circuit board of the present invention includes two or more layers of electrical insulative base members, the flexibility of circuit design can be enhanced. For instance, in the case where no coil patterns are formed on at least one of both principal surfaces of the board, a component such as a capacitor can be mounted directly above the coil. In this case, the direction of the magnetic flux generated from the coil becomes parallel with the principal surfaces, and therefore the component mounted on the principal surface becomes less prone to being affected by the noise due to the change in magnetic flux generated from the coil.

Further, an outer shape of the coil may have a toroidal shape. Such a toroidal outer shape of the coil allows the leakage of the magnetic flux generated from the coil to be decreased, so that actual values of inductance will be approximate to the theoretical value. Thereby, inductances can be obtained with accuracy, which facilitates the design of a circuit.

Further, in the case where the multilayer circuit board of the present invention includes: three or more layers of the electrical insulative base members; and four or more layers of the conductive patterned layers, the winding number of the coil can be increased not only in the direction perpendicular to the thickness direction of the board, but also in the thickness direction of the board. For instance, in the case of using a three-layered electrical insulative base members, a coil can be formed to be double-wound continuously in the thickness direction of the board. In the case of using (2n+1)—layered electrical insulative base members, a coil can be formed to be (n+1)th—wound, at the maximum, continuously in the thickness direction of the board, where n represents a natural number. With this configuration, a coil with a large inductance can be obtained.

Note here that the winding number of the coil provided in the multilayer circuit board of the present invention is not limited in either of the thickness direction of the board and the direction perpendicular to the thickness direction of the board, and the winding number can be set appropriately depending on the intended use. Further, the through holes enabling the communication between the respective end portions of the coil patterns can be formed by a well-known method, for example, by laser processing or the like. Further, the conductive paste charged in the through holes is not limited particularly, and preferably, a conductive paste containing: a powder made of at least one type of metal selected from the group consisting of silver, copper, gold and nickel; and a thermosetting resin such as an epoxy resin is used in order to secure the stable electrical connection.

Further, in the case where the multilayer circuit board of the present invention includes three or more layers of the electrical insulative base members, metal foils further may be disposed on both principal surfaces of the multilayer circuit board so as to sandwich the coil. With this configuration, the magnetic field generated from the coil can be shielded.

Further, the multilayer circuit board of the present invention may be configured so that no conductive patterned layer is formed on at least one of both principal surfaces of the multilayer circuit board. With this configuration, the principal surface with no conductive patterned layers formed thereon is isolated electrically, and therefore the board can be attached directly to a metal enclosure or the like where this principal surface serves as the attachment surface.

Further, in the case where the multilayer circuit board of the present invention includes three or more layers of the conductive patterned layers, at least one of the conductive patterned layers may include a circuit wiring, and at least a part of the circuit wiring may be disposed inside the coil. With this configuration, a function of detecting a current flowing through the circuit wiring can be assigned to the coil.

Further, the multilayer circuit board of the present invention may include a plurality of the coils having different winding numbers, and the plurality of coils may be each disposed within a range enabling interaction of mutual magnetic fields. With this configuration, a voltage conversion function can be assigned to the coil. Moreover, in this configuration, a magnetic member further may be disposed inside the plurality of coils. According to this configuration, a voltage conversion function with excellent transmission efficiency can be assigned to the coil. Note here that the wording "disposed within a range enabling interaction of mutual magnetic fields" represents that, in the case where a multilayer circuit board includes a first coil and a second coil, for example, the second coil is disposed within a range in which the magnetic field generated by the first coil acts and the first coil is disposed within a range in which the magnetic field generated by the second coil acts.

Further, the multilayer circuit board of the present invention may include a plurality of the coils having a uniform winding number, and the plurality of coils may be each disposed within a range enabling interaction of mutual magnetic fields. With this configuration, a noise filter function can be assigned to the coil. The following describes embodiments of the present invention in detail.

Embodiment 1

Firstly, Embodiment 1 of the present invention will be described below, with reference to the drawings as needed. FIG. 1A to be referred to in the following is a perspective view of a multilayer circuit board according to Embodiment 1 of the present invention, showing each layer separately, and FIG. 1B is a cross-sectional view of the multilayer circuit board according to Embodiment 1 taken along the line I-I of FIG. 1A.

Figure 1B:
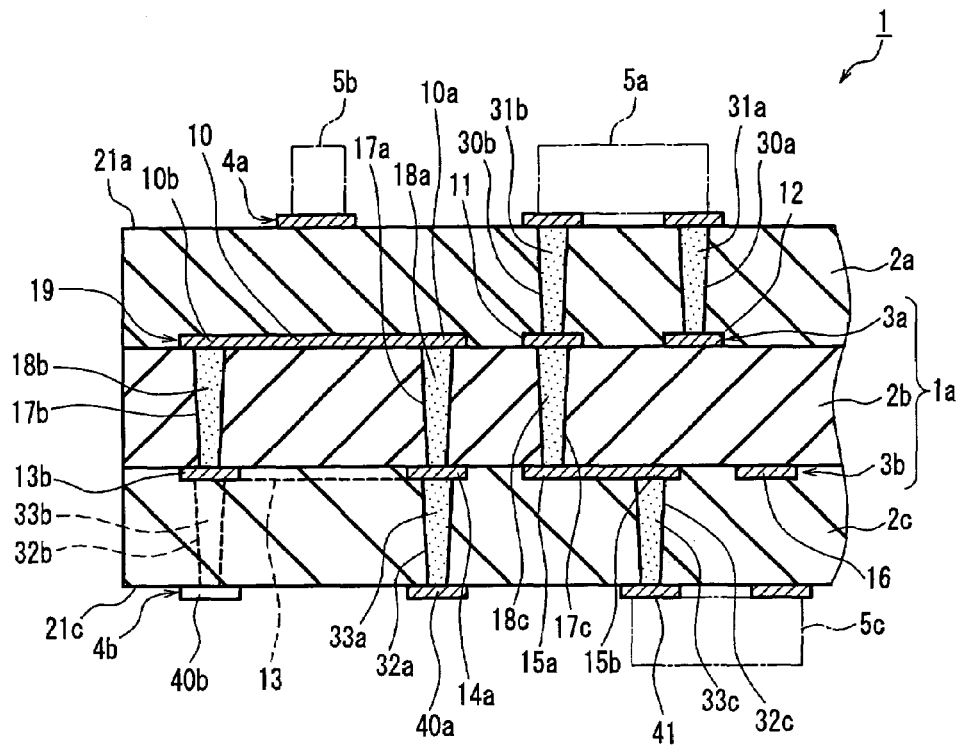
FIG. 1B is a cross-sectional view of the multilayer circuit board according to Embodiment 1 taken along the line I-I of FIG. 1A.

As shown in FIGS. 1A and 1B, a multilayer circuit board 1 according to Embodiment 1 of the present invention includes: electrical insulative base members 2a, 2b and 2c; a conductive patterned layer 3a provided between the electrical insulative base member 2a and the electrical insulative base member 2b; a conductive patterned layer 3b provided between the electrical insulative base member 2b and the electrical insulative base member 2c; and conductive patterned layers 4a and 4b respectively provided on outer surfaces 21a and 21c of the electrical insulative base members 2a and 2c (i.e., both principal surfaces of the multilayer circuit board 1). Thicknesses of the respective layers are for example as follows: the electrical insulative base members 2a to 2c are about 8 to 500 μm in thickness and the conductive patterned layers 3a, 3b, 4a and 4b are in the range of about 3 to 50 μm in thickness.

As shown in FIG. 1A, the conductive patterned layer 3a includes: a plurality of coil patterns 10 that are formed parallel with each other to have a uniform length; a land 11; and a conductor 12. The conductive patterned layer 3b includes: a plurality of coil patterns 13 that are formed parallel with each other to have a uniform length, coil end portions 14a and 14b; lands 15a and 15b; and a conductor 16. The coil patterns 10 and 13 each have a width ranging from about 10 to 10,000 μm, for example. Pitches of the coil patterns 10 and 13 range from about 30 to 3,000 μm, for example.

Further, the coil patterns 10 and 13 respectively include a plurality coil pattern end portions 10a and 13a provided backward of FIG. 1A and a plurality of coil pattern end portions 10b and 13b provided forward of FIG. 1A. Then, the coil end portion 14a is provided in a row arrangement with the coil pattern end portions 13a and the coil end portion 14b is provided in a row arrangement with the coil pattern end portions 13b. Herein, the minimum diameter of the respective end portions preferably is 20 μm or more so as to secure the stable electrical connection. Further, the coil end portion 14a and the coil pattern end portions 13a are disposed at positions right in the back of the corresponding coil pattern end portions 10a, respectively. Similarly, the coil end portion 14b and the coil pattern end portions 13b are disposed at positions right in the back of the corresponding coil pattern end portion 10b, respectively. It should be noted that the coil pattern end portions 10a, 10b, 13a and 13b correspond to "respective end portions of the coil patterns" recited in claims.

The electrical insulative base member 2b is provided with a plurality of through holes 17a along the thickness direction of the electrical insulative base member 2b, where the through holes 17a enable the communication of the coil end portion 14a and the coil pattern end portions 13a with the coil pattern end portions 10a. Similarly, the electrical insulative base member 2b is provided with a plurality of through holes 17b along the thickness direction of the electrical insulative base member 2b, where the through holes 17b enable the communication of the coil end portion 14b and the coil pattern end portions 13b with the coil pattern end portions 10b. The minimum diameter of the through holes 17a and 17b preferably is 10 μm or more so as to secure the stable electrical connection.

Figure 10:
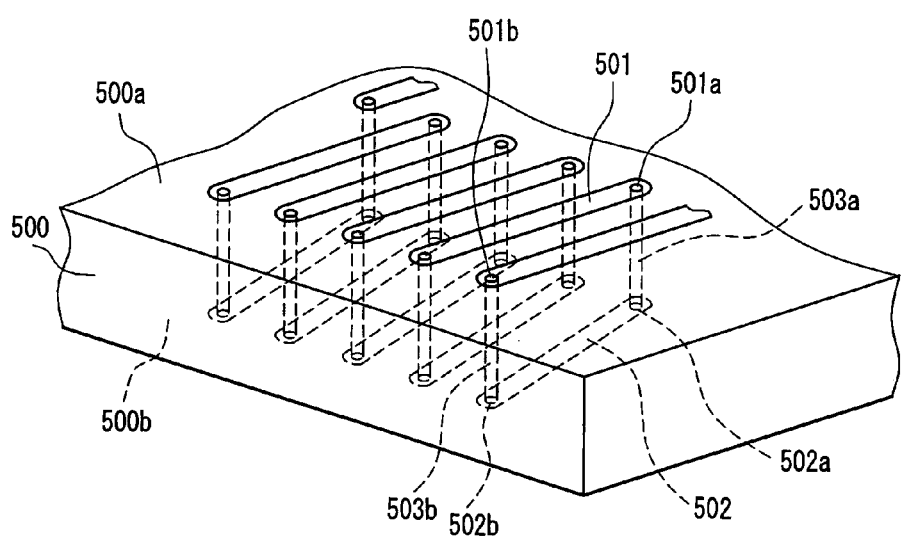
FIG. 10 is a perspective view showing a conventional coil structure.

Then, the through holes 17a and 17b are filled with conductive paste, whereby conductive portions 18a and 18b are formed, and the respective end portions are connected electrically with each other as shown in FIG. 1B. With this configuration, a coil 19 is formed so as to be wound in the direction perpendicular to the thickness direction of the multilayer circuit board 1. Since this coil 19 is wound in the direction perpendicular to the thickness direction of the multilayer circuit board 1, the direction of the magnetic flux generated from the coil 19 becomes parallel with the outer surfaces 21a and 21c of the electrical insulative base members 2a and 2c. As a result, as shown in FIGS. 1A and 1B, components 5a, 5b and 5c (indicated by alternate long and short dash lines in the drawings) packaged on the conductive patterned layers 4a and 4b become less prone to being affected by the noise due to the change in magnetic flux generated from the coil 19. In addition, according to the present embodiment, the coil 19 is formed within the multilayer circuit board 1, and therefore the components 5a, 5b and 5c become even less prone to being affected by the noise compared with the above-stated conventional double-sided circuit board equipped with a coil configuration (See FIG. 10).

The electrical insulative base member 2b further is provided with a through hole 17c that allows the communication of the land 11 with the land 15a. Similarly to the through holes 17a and 17b, this through hole 17c also is filled with conductive paste, whereby a conductive portion 18c is formed. With this configuration, the land 11 and the land 15a are connected electrically with each other.

The electrical insulative base member 2a is provided with a through hole 30a and a through hole 30b, where the through hole 30a allows the communication of the conductive patterned layer 4a with the conductor 12 and the through hole 30b allows the communication of the conductive patterned layer 4a with the land 11. Then, the respective through holes 30a and 30b are filled with conductive paste, whereby conductive portions 31a and 31b are formed. With this configuration, the conductive patterned layer 4a and the conductor 12 or the land 11 are connected electrically with each other.

The electrical insulative base member 2c is provided with a through hole 32a, a through hole 32b and a through hole 32c, where the through holes 32a allows the communication of an outermost layer end portion 40a provided at the conductive patterned layer 4b with the coil end portion 14a, the through hole 32b allows the communication of an outermost layer end portion 40b provided at the conductive patterned layer 4b with the coil end portion 14b, and the through hole 32c allows the communication of an outermost layer end portion 41 provided at the conductive patterned layer 4b with the land 15b. Then, the respective through holes 32a, 32b and 32c are filled with conductive paste, whereby conductive portions 33a, 33b and 33c are formed. With this configuration, the outermost layer end portions 40a, 40b and 41 are connected electrically with the coil end portion 14a, the coil end portion 14b and the land 15b, respectively.

Note here that, in the present embodiment, although the conductive patterned layers 4a and 4b are provided on the outer surfaces 21a and 21c of the electrical insulative base members 2a and 2c, the multilayer circuit board of the present invention is not limited to this. For instance, the outer surface 21a of the electrical insulative base member 2a may be an electrical insulative surface, instead of the provision of the conductive patterned layer 4a. With this configuration, the multilayer circuit board 1 can be attached directly to a metal enclosure or the like, where such an outer surface 21a of the electrical insulative base member 2a serves as the attachment surface.

The following describes an exemplary manufacturing method of the multilayer circuit board 1 according to Embodiment 1 of the present invention. Firstly, protective films made of polyethylene terephthalate or the like are laminated on upper and lower surfaces of the electrical insulative base member 2b containing a thermosetting resin, and the through holes 17a, 17b and 17c are formed at predetermined positions by means of laser processing or the like. Next, these through holes 17a, 17b and 17c are filled with conductive paste by means of printing or the like, and then the protective films are peeled off. Thereby, prepregs can be obtained, in which the conductive paste protrudes by the thickness of the protective films. Subsequently, copper foils are disposed on upper and lower surfaces of these prepregs, and hot pressing is applied thereto with 0.5 to 100 MPa of pressure and at 150 to 260° C. of temperature for 5 minutes to 3 hours, for example, whereby the electrical insulative base member 2b is bonded to the copper foils and the conductive paste charged in the through holes 17a, 17b and 17c allows electrical continuity to be established between the copper foils on the upper and the lower surfaces. Thereafter, the copper foils on the upper and the lower surfaces are patterned as shown in FIG. 1A, whereby a double-sided circuit board 1a (See FIGS. 1A and 1B) can be obtained. Furthermore, prepregs filled with conductive paste are disposed in a manner similar to the above on upper and lower surfaces of this double-sided circuit board 1a with the double-sided circuit board 1a used as a core member, and copper foils are disposed on the outsides thereof, followed by hot pressing and patterning, whereby the multilayer circuit board 1 can be obtained.

Embodiment 2

Figure 2:
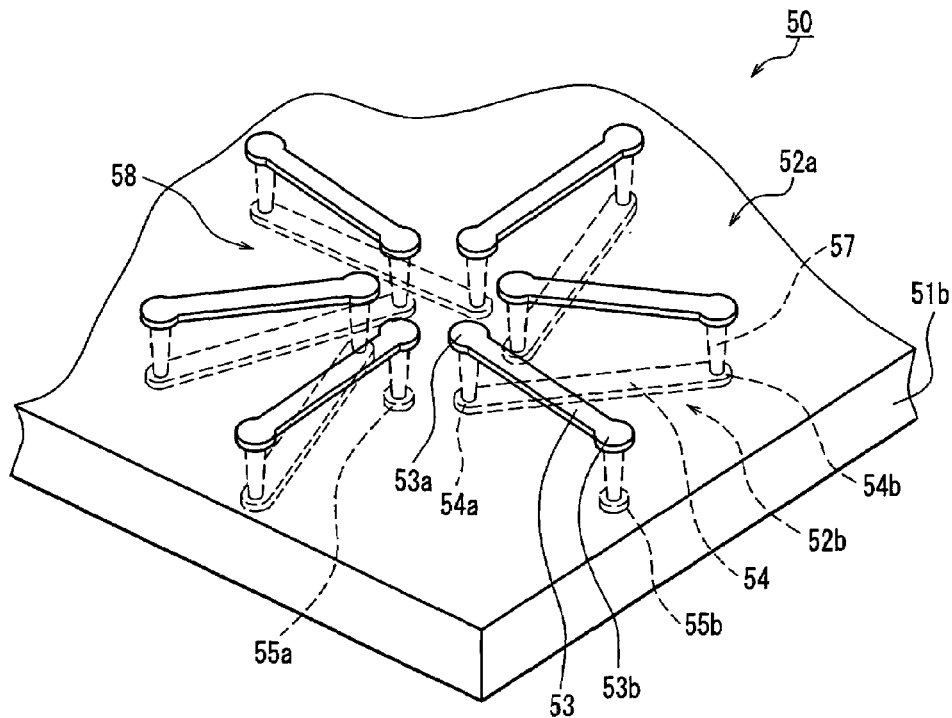
FIG. 2 is a perspective view of a layer provided with a coil in a multilayer circuit board according to Embodiment 2 of the present invention.

The following describes Embodiment 2 of the present invention, with reference to the drawings as needed. FIG. 2 to be referred to in the following is a perspective view of a layer provided with a coil in a multilayer circuit board according to Embodiment 2 of the present invention. Since Embodiment 2 is different from Embodiment 1 only in the outside shape of the coil, the following describes such a difference only.

As shown in FIG. 2, a multilayer circuit board 50 according to Embodiment 2 of the present invention includes: conductive patterned layers 52a and 52b provided on upper and lower surfaces of an electrical insulative base member 51b (corresponding to the electrical insulative base member 2b of Embodiment 1), respectively. Although not illustrated, an electrical insulative base member is provided on the outside of each of the conductive patterned layers 52a and 52b, and a conductive patterned layer further is provided on the outside of each electrical insulative base member.

At the conductive patterned layer 52a, a plurality of coil patterns 53 having a uniform length are disposed in a toroidal shape. At the conductive patterned layer 52b, a plurality of coil patterns 54 having a uniform length are disposed in a toroidal shape, and coil end portions 55a and 55b further are provided. The coil patterns 53 and 54 respectively have a plurality of coil pattern end portions 53a and 54a on their inner radius sides and a plurality of coil pattern end portions 53b and 54b on their outer radius sides. The coil end portion 55a is disposed on the inner radius side of the coil patterns 54, and the coil end portion 55b is disposed on the outer radius side of the coil patterns 54. Further, the coil end portion 55a and the coil pattern end portions 54a are disposed at positions right in the back of the respective corresponding coil pattern end portions 53a, and similarly the coil end portion 55b and the coil pattern end portions 54b are disposed at positions right in the back of the respective corresponding coil pattern end portions 53b.

Further, a plurality of conductive portions 57 are formed in a manner similar to Embodiment 1, that is, the plurality of conductive portions 57 penetrate the electrical insulative base member 51b and enable the communication between the above-mentioned respective end portions (also in embodiments described later, all of their conductive portions are formed in a manner similar to Embodiment 1), so that the conductive portions 57 enable the electrical connection between the above-stated respective end portions. With this configuration, a coil 58 is formed within the multilayer circuit board 50, the coil being wound in the direction perpendicular to the thickness direction of the electrical insulative base member 51b. Herein, the outer shape of this coil 58 is formed in a toroidal shape. Such a toroidal outer shape of the coil 58 allows the leakage of the magnetic flux generated from the coil 58 to be decreased, so that actual values of inductance will be approximate to the theoretical value. Thereby, inductances can be obtained with accuracy, which facilitates the design of a circuit.

Embodiment 3

Figure 3A:
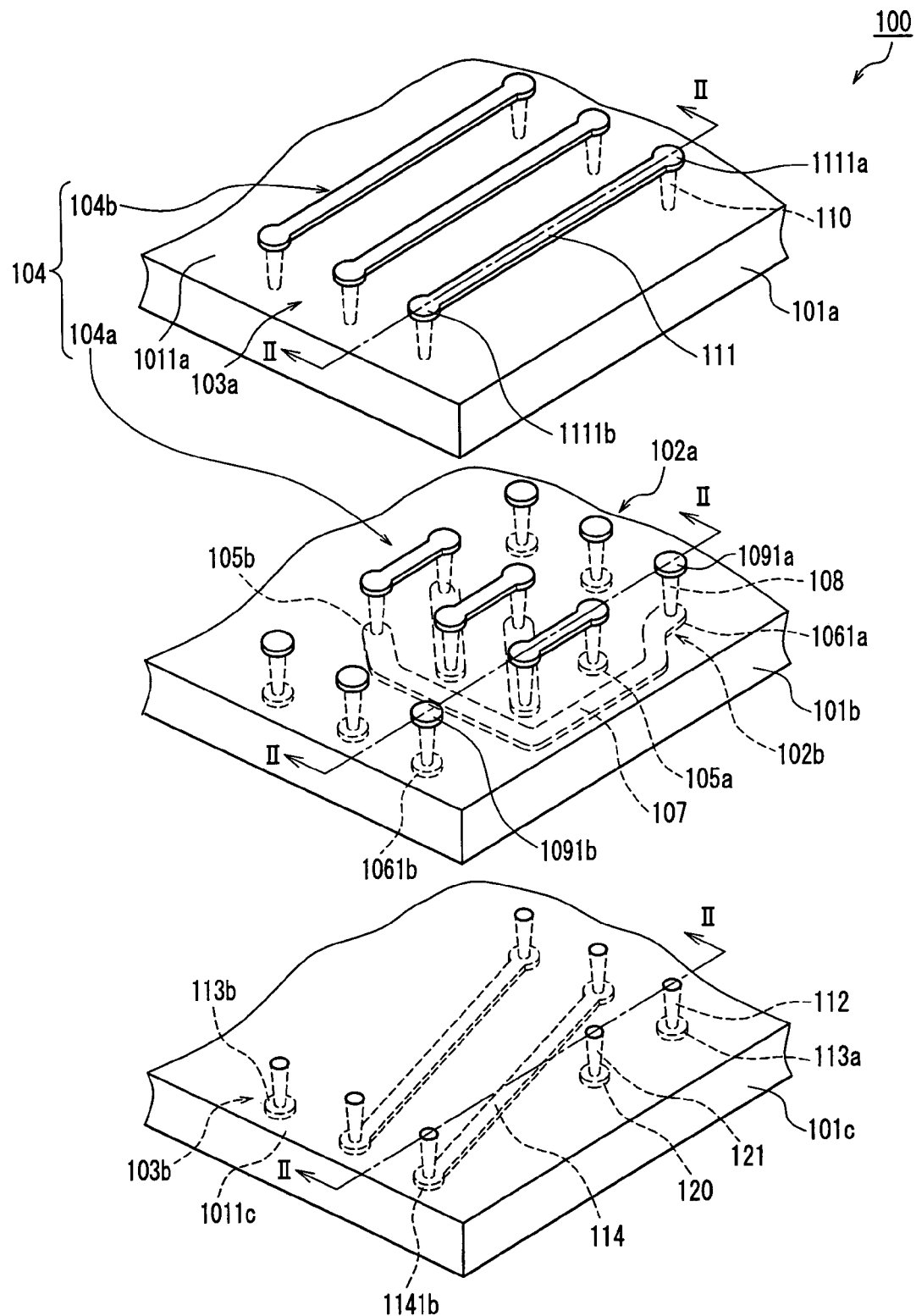
FIG. 3A is a perspective view of a multilayer circuit board according to Embodiment 3 of the present invention, showing each layer separately.

The following describes Embodiment 3 of the present invention, with reference to the drawings as needed. FIG. 3A to be referred to in the following is a perspective view of a multilayer circuit board according to Embodiment 3 of the present invention, showing each layer separately, and FIG. 3B is a cross-sectional view of the multilayer circuit board according to Embodiment 3 taken along the line II-II of FIG. 3A.

Figure 3B:
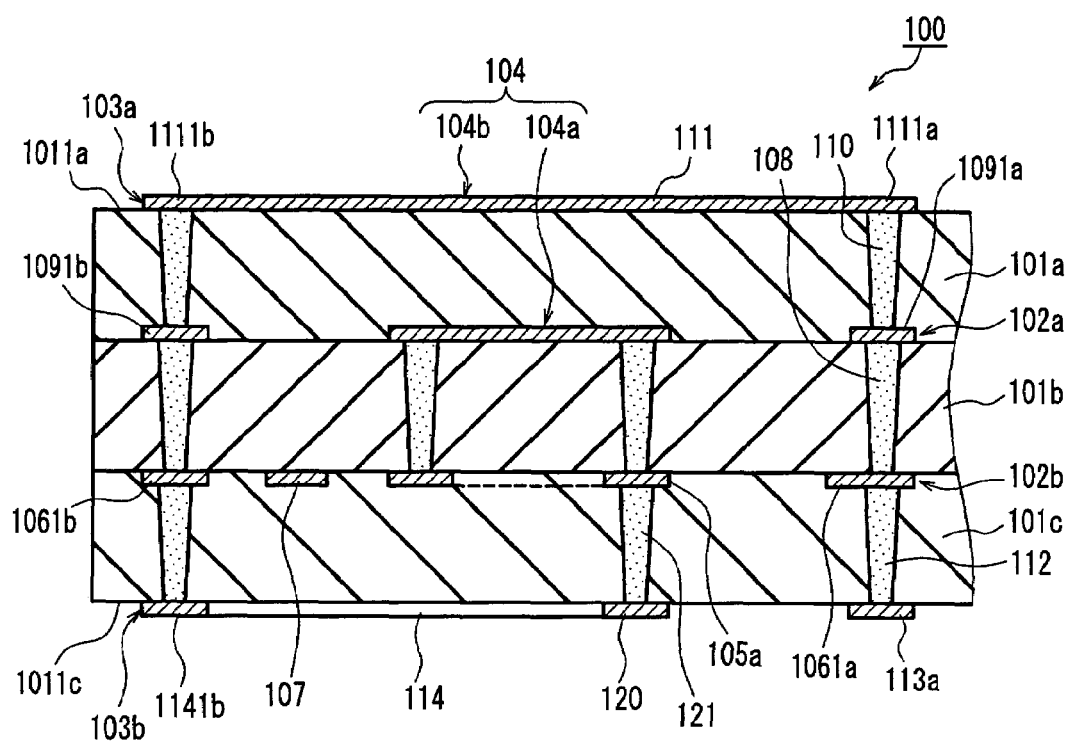
FIG. 3B is a cross-sectional view of the multilayer circuit board according to Embodiment 3 taken along the line II-II of FIG. 3A.

As shown in FIGS. 3A and 3B, a multilayer circuit board 100 according to Embodiment 3 includes: electrical insulative base members 101a to 101c; conductive patterned layers 102a and 102b provided between the respective electrical insulative base members 101a to 101c; and conductive patterned layers 103a and 103b respectively provided on outer surfaces of 1011a and 101c of the electrical insulative base members 101a and 101c. The multilayer circuit board 100 further includes a first coil 104a formed inside and a second coil 104b formed around this first coil 104a. Both of the first coil 104a and the second coil 104b are wound in the direction perpendicular to the thickness direction of the multilayer circuit board 100. Moreover, as described later, the first coil 104a and the second coil 104b are connected electrically, so that a coil 104 is formed to be double-wound continuously in the thickness direction of the multilayer circuit board 100.

The first coil 104a is formed similarly to the coil 19 of Embodiment 1 (See FIGS. 1A and 1B), and coil end portions 105a and 105b thereof are provided at the conductive patterned layer 102b. Then, the coil end portion 105a is connected electrically with an outermost layer end portion 120 provided at the conductive patterned layer 103b via a conductive portion 121 formed so as to penetrate the electrical insulative base member 101c. The coil end portion 105b is connected electrically with a land 1061a provided at the conductive patterned layer 102b via a wiring 107 provided also at the conductive patterned layer 102b.

The land 1061a is connected electrically with a land 1091a provided at the conductive patterned layer 102a via a conductive portion 108 formed so as to penetrate the electrical insulative base member 101b. Further, the land 1091a is connected electrically with a coil pattern end portion 1111a of a coil pattern 111 provided at the conductive patterned layer 103a via a conductive portion 110 formed so as to penetrate the electrical insulative base member 101a. Further, the land 1061a is connected electrically with a coil end portion 113a provided at the conductive patterned layer 103b via a conductive portion 112 formed so as to penetrate the electrical insulative base member 101c. With this configuration, the coil end portion 113a, the land 1061a, the land 1091a and the coil pattern end portion 1111a are connected electrically.

Similarly, a coil pattern end portion 1111b located on the opposite side of the coil pattern end portion 1111a is connected electrically with a land 1091b located right in the back of the coil pattern end portion 1111b, the land 1091b is connected electrically with a land 1061b located right in the back of the land 1091b, and the land 1061b is connected electrically with a coil pattern end portion 1141b of a coil pattern 114 located right in the back of the land 1061b. With this configuration, the coil pattern end portion 1111b, the land 1091b, the land 1061b and the coil pattern end portion 1141b are connected electrically.

Similarly to the above, the portion from the coil end portion 113a to a coil end portion 113b provided at the conductive patterned layer 103b is connected electrically, so that the second coil 104b is formed around the first coil 104a. In this way, the coil 104 is formed so as to be double-wound continuously in the thickness direction of the multilayer circuit board 100. Thereby, the coil 104 with a large inductance can be obtained.

Embodiment 4

Figure 4A:
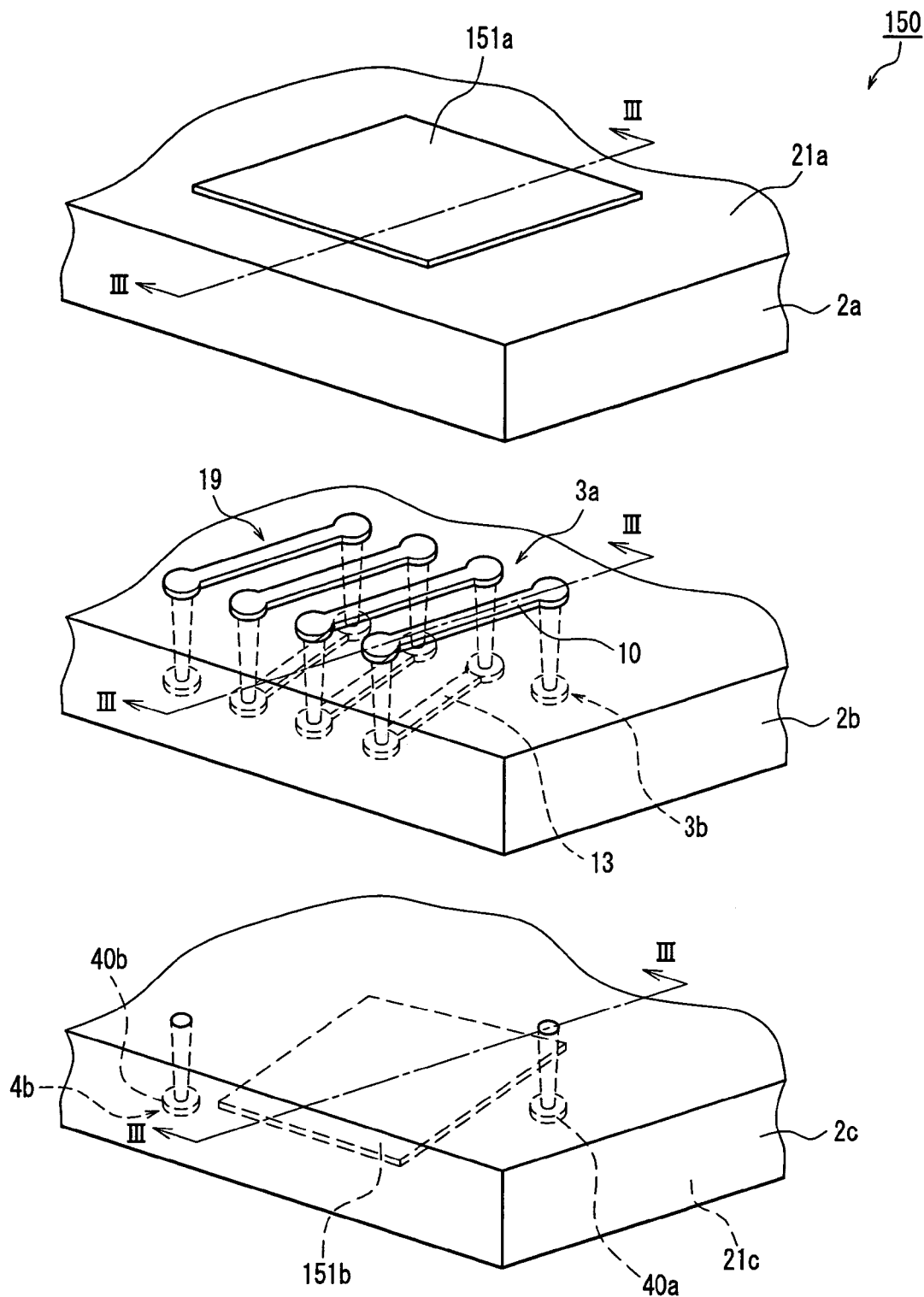
FIG. 4A is a perspective view of a multilayer circuit board according to Embodiment 4 of the present invention, showing each layer separately.

The following describes Embodiment 4 of the present invention, with reference to the drawings as needed. FIG. 4A to be referred to in the following is a perspective view of a multilayer circuit board according to Embodiment 4 of the present invention, showing each layer separately, and FIG. 4B is a cross-sectional view of the multilayer circuit board according to Embodiment 4 taken along the line III-III of FIG. 4A.

A multilayer circuit board 150 according to Embodiment 4 of the present invention is configured so that the conductive patterned layer 4a of the above-stated configuration of Embodiment 1 (See FIG. 1A) is not provided but metal foils 151a and 151b respectively are provided on the outer surfaces 21a and 21c of the electrical insulative base members 2a and 2c. In the following description, the same reference numerals are assigned to the same configurations as those of Embodiment 1 and their explanations are omitted.

Figure 4B:
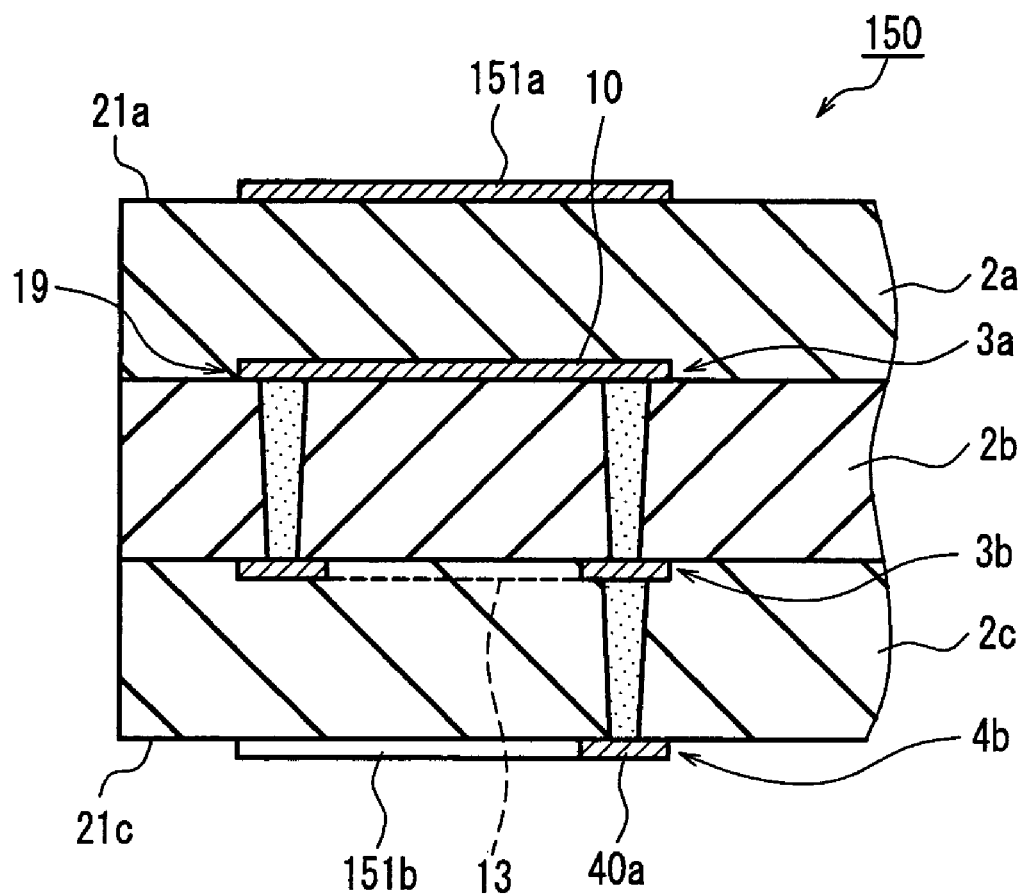
FIG. 4B is a cross-sectional view of the multilayer circuit board according to Embodiment 4 taken along the line III-III of FIG. 4A.

As shown in FIGS. 4A and 4B, on the outer surface 21a of the electrical insulative base member 2a, the metal foil 151a is provided by hot pressing or the like so as to cover the substantially entire surface of the plurality of coil patterns 10 formed at the conductive patterned layer 3a. Further, on the external surface 21c of the electrical insulative base member 2c, the metal foil 151b is provided by hot pressing or the like so as to cover the substantially entire surface of the plurality of coil patterns 13 formed at the conductive patterned layer 3b, where the metal foil 151b has such a size as to avoid a short between outermost layer end portions 40a and 40b. In this way, since the metal foils 151a and 151b are disposed so as to sandwich the coil 19 therebetween, the magnetic field generated from the coil 19 can be shielded. Herein, as the metal foils 151a and 151b, copper foil, aluminum foil and the like having a thickness of about 5 to 100 μm can be used, for example.

Embodiment 5

Figure 5B:
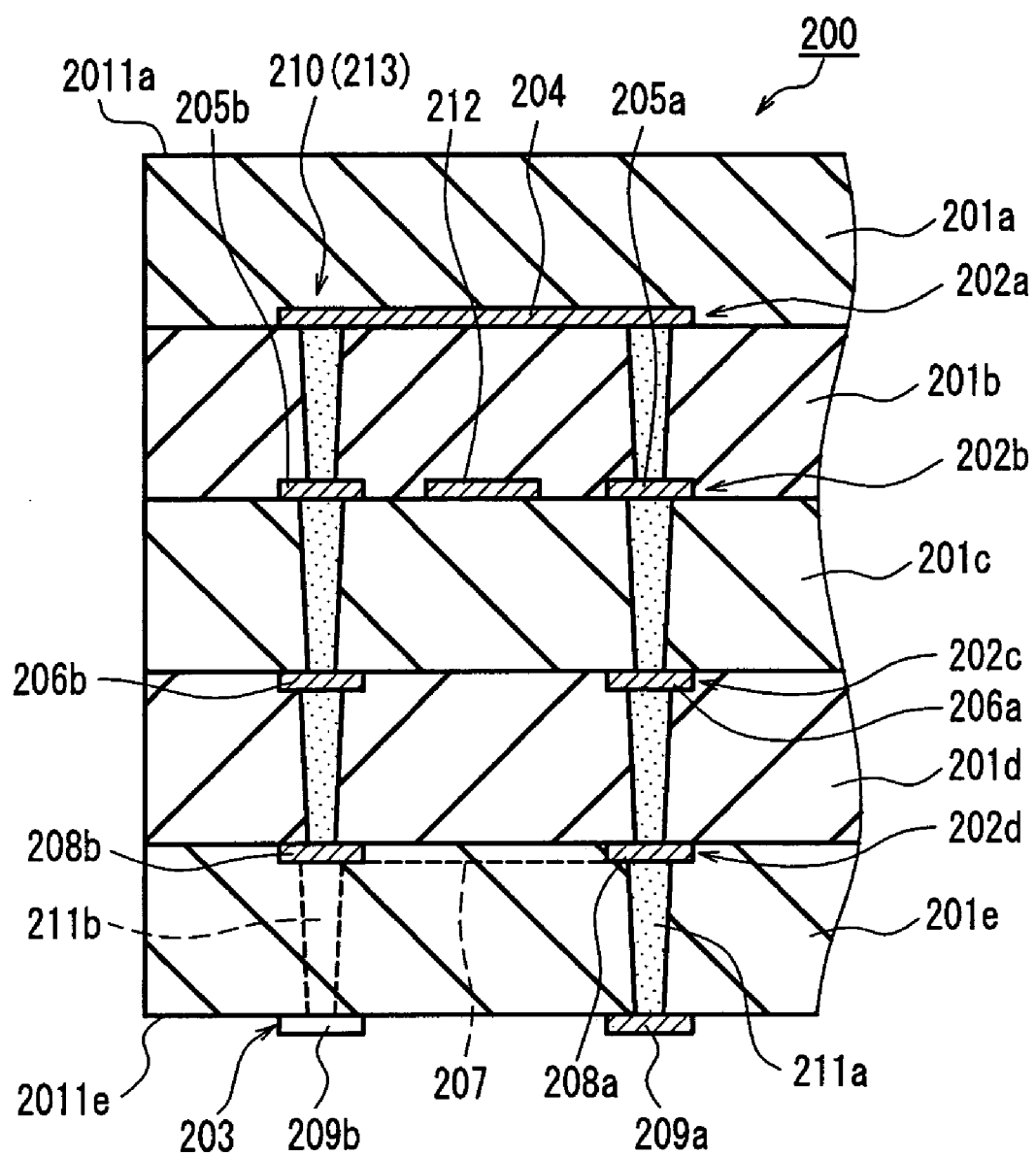
FIG. 5B is a cross-sectional view of the multilayer circuit board according to Embodiment 5 taken along the line IV-IV of FIG. 5A.

The following describes Embodiment 5 of the present invention, with reference to the drawings as needed. FIG. 5A to be referred to in the following is a perspective view of a multilayer circuit board according to Embodiment 5 of the present invention, showing each layer separately, and FIG. 5B is a cross-sectional view of the multilayer circuit board according to Embodiment 5 taken along the line IV-IV of FIG. 5A.

As shown in FIGS. 5A and 5B, a multilayer circuit board 200 according to Embodiment 5 includes: electrical insulative base members 201a to 201e; conductive patterned layers 202a to 202d provided between the respective electrical insulative base members 201a to 201e; and a conductive patterned layer 203 provided on an outer surface 2011e of the electrical insulative base member 201e. In this multilayer circuit board 200, no conductive patterned layer is formed on an outer surface 2011a of the electrical insulative base member 201a. With this configuration, the outer surface 2011a of the electrical insulative base member 201a is isolated electrically, and therefore the multilayer circuit board 200 can be attached directly to a metal enclosure (not illustrated) or the like where such an outer surface 2011a serves as the attachment surface.

As shown in FIG. 5A, the conductive patterned layer 202a includes two coil patterns 204 formed to have a uniform length and parallel with each other. The conductive patterned layer 202b includes two lands 205a provided backward of FIG. 5A and two lands 205b provided forward of FIG. 5A. Similarly, the conductive patterned layer 202c includes two lands 206a provided backward of FIG. 5A and two lands 206b provided forward of FIG. 5A. The conductive patterned layer 202d includes a coil pattern 207, a coil end portion 208a and a coil end portion 208b. The conductive patterned layer 203 is provided with an outermost layer end portion 209a located right in the back of the coil end portion 208a and an outermost layer end portion 209b located right in the back of the coil end portion 208b.

As shown in FIG. 5B, similarly to the second coil 104b of Embodiment 3 (See FIGS. 3A and 3B), the portion from the coil end portion 208a to the coil end portion 208b is connected electrically, so as to form a coil 210. Further, the coil end portion 208a and the outermost layer end portion 209a are connected electrically via a conductive portion 211a formed so as to penetrate the electrical insulative base member 201e, and the coil end portion 208b and the outermost layer end portion 209b are connected electrically via a conductive portion 211b also formed so as to penetrate the electrical insulative base member 201e.

Further, as shown in FIG. 5A, at the conductive patterned layer 202b, a circuit wiring 212 is formed so as to run between the lands 205a and 205b. That is, a portion of this circuit wiring 212 is disposed inside the coil 210. In this way, the multilayer circuit board 200 is configured so as to include a current detection circuit 213 (i.e., the coil 210) that detects a current flowing through the circuit wiring 212.

The following describes the operation of the current detection circuit 213. When a current flows through the circuit wiring 212, an electromotive force is generated at the coil 210 by electromagnetic induction. This electromotive force is measured between the outermost layer end portions 209a and 209b, and a current value flowing through the circuit wiring 212 can be determined in accordance with a predetermined conversion formula. Herein, in order to perform the current detection accurately, an operational amplifier (not illustrated) preferably is used for amplifying a voltage obtained between the outermost layer end portions 209a and 209b.

Incidentally, although the coil pattern 207 is disposed at the conductive patterned layer 202d in the present embodiment, the coil pattern 207 may be disposed at the conductive patterned layer 202c. Further, although the coil 210 is double-wound around the circuit wiring 212, the present invention is not limited to this, and the winding number of the coil can be set appropriately based on the measurement accuracy required for the current detection.

Embodiment 6

Figure 6A:
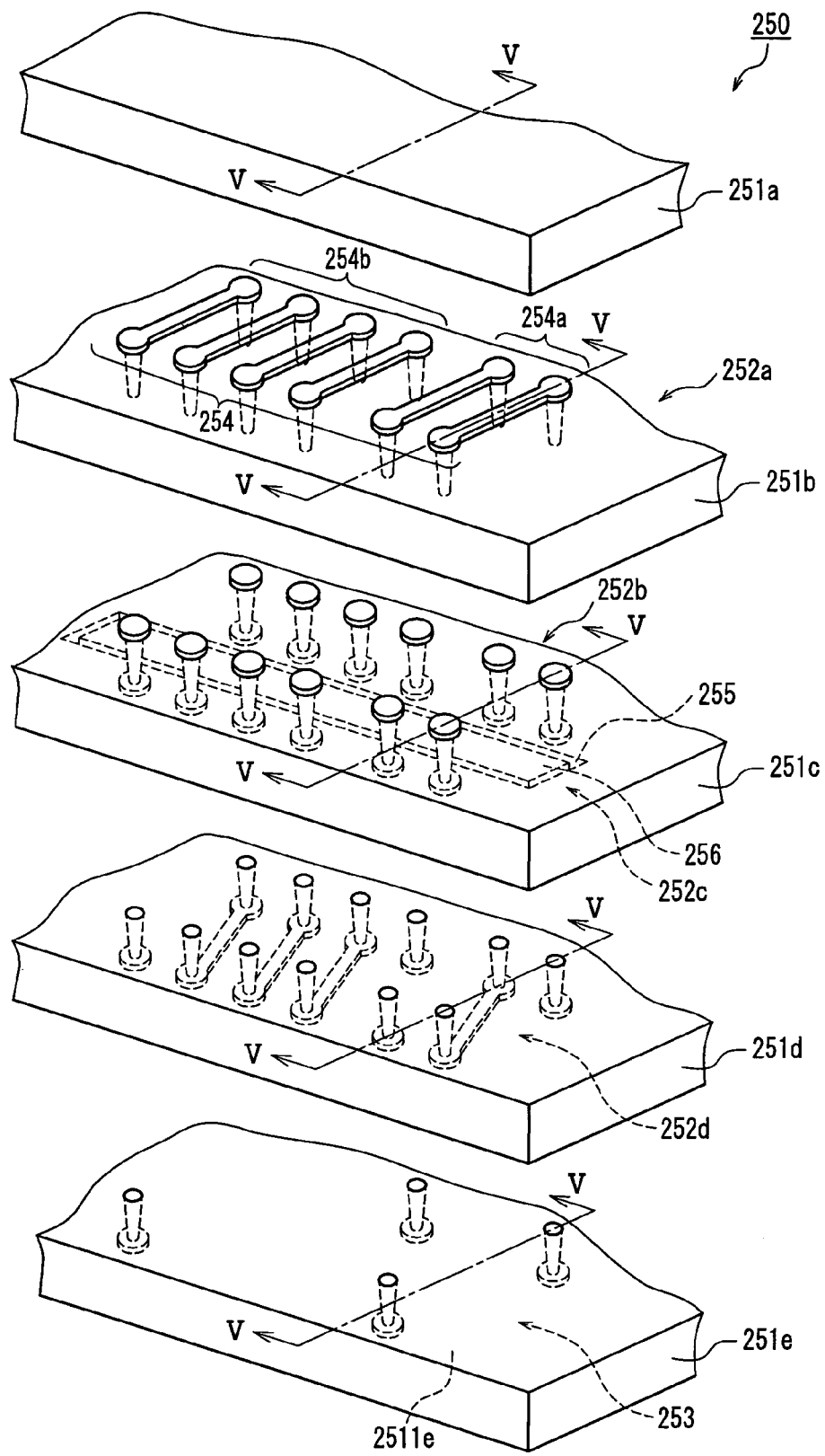
FIG. 6A is a perspective view of a multilayer circuit board according to Embodiment 6 of the present invention, showing each layer separately.

The following describes Embodiment 6 of the present invention, with reference to the drawings as needed. FIG. 6A to be referred to in the following is a perspective view of a multilayer circuit board according to Embodiment 6 of the present invention, showing each layer separately, and FIG. 6B is a cross-sectional view of the multilayer circuit board according to Embodiment 6 taken along the line V-V of FIG. 6A.

Figure 6B:
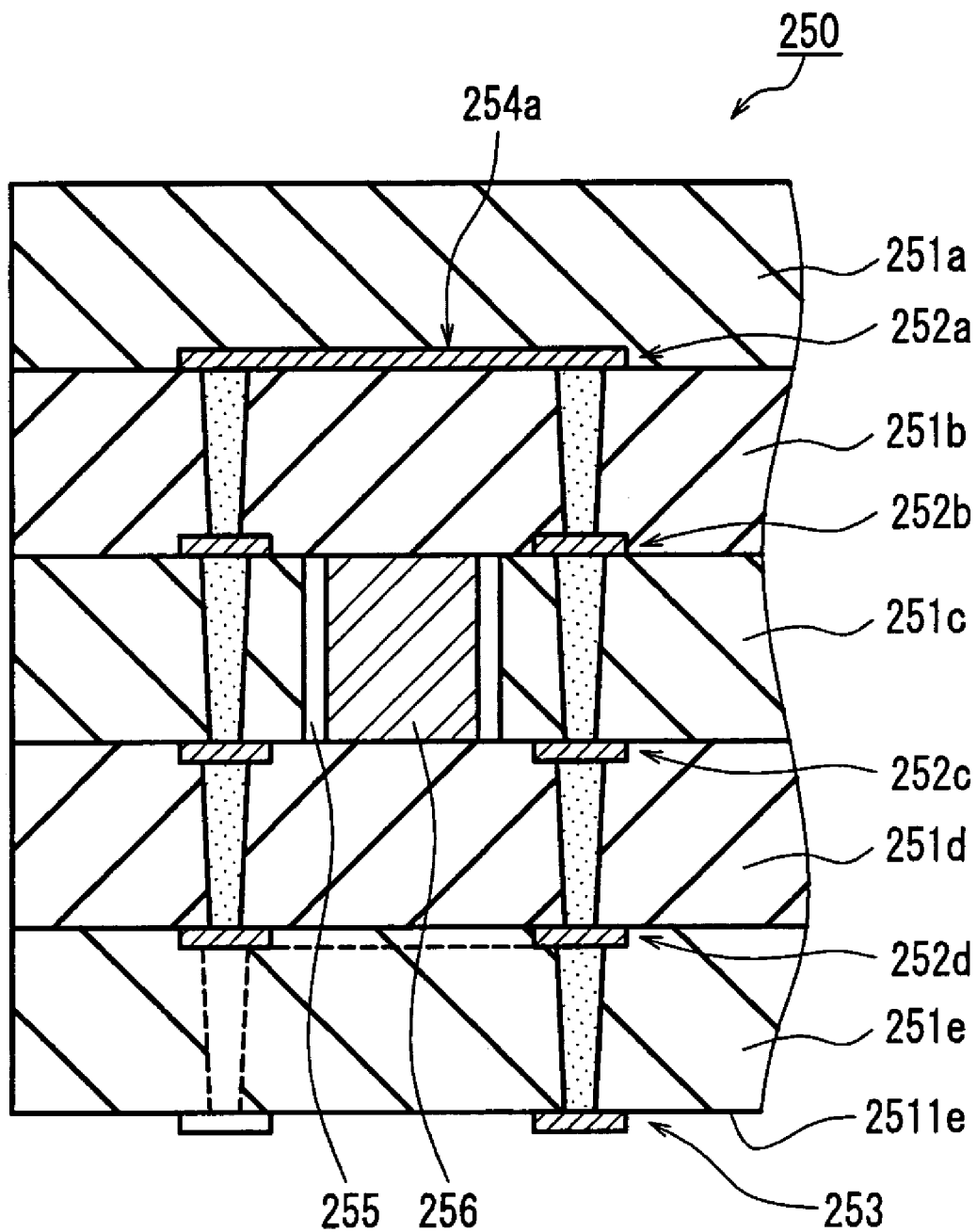
FIG. 6B is a cross-sectional view of the multilayer circuit board according to Embodiment 6 taken along the line V-V of FIG. 6A.

As shown in FIGS. 6A and 6B, a multilayer circuit board 250 according to Embodiment 6 includes: electrical insulative base members 251a to 251e; conductive patterned layers 252a to 252d provided between the respective electrical insulative base members 251a to 251e; and a conductive patterned layer 253 provided on an outer surface 2511e of the electrical insulative base member 251e. Further, inside the multilayer circuit board 250, a first coil 254a and a second coil 254b are provided, where the first coil 254a and the second coil 254b are disposed within a range enabling the interaction of mutual magnetic fields. Then, the first coil 254a is double-wound in the direction perpendicular to the thickness direction of the multilayer circuit board 250, and the second coil 254b is quadruple-wound in the direction perpendicular to the thickness direction of the multilayer circuit board 250. In this way, the multilayer circuit board 250 is configured so as to include a transformer 254 having a voltage conversion function. Herein, the connection between the respective end portions provided in each coil is similar to the above-stated Embodiment 5.

Further, inside the electrical insulative base member 251c, a groove portion 255 is provided along a center axis common to the first coil 254a and the second coil 254b, and a magnetic member 256 is disposed within this groove portion 255. That is, the first coil 254a and the second coil 254b are disposed so as to surround the magnetic member 256 and within a range enabling the interaction of mutual magnetic fields. Thereby, the transformer 254 can be provided to have a high transmission efficiency for voltage conversion. Herein, as a material of the magnetic member 256, a thin plate made of iron-based materials such as ferrite, one made by solidifying iron-based powder and the like are preferable.

As for the voltage conversion function, in the case where the first coil 254a is double-wound and the second coil 254b is quadruple-wound as in the present embodiment, though depending on the distance between the first coil 254a and the second coil 254b, a voltage supply of 2 V from the first coil 254a side will provide the output of about 3.5 V from the second coil 254b (reference value).

Although the present embodiment exemplifies the case where the first coil 254a is double-wound and the second coil 254b is quadruple-wound, the present invention is not limited to this. The winding number can be set appropriately based on the required output for the convention. Further, although in the present embodiment, the magnetic member 256 is provided along the central axis common to the first coil 254 and the second coil 254b, the present invention is not limited to this. A transformer can be formed with a plurality of coils having different winding numbers only and without the use of the magnetic member.

Embodiment 7

Figure 7B:
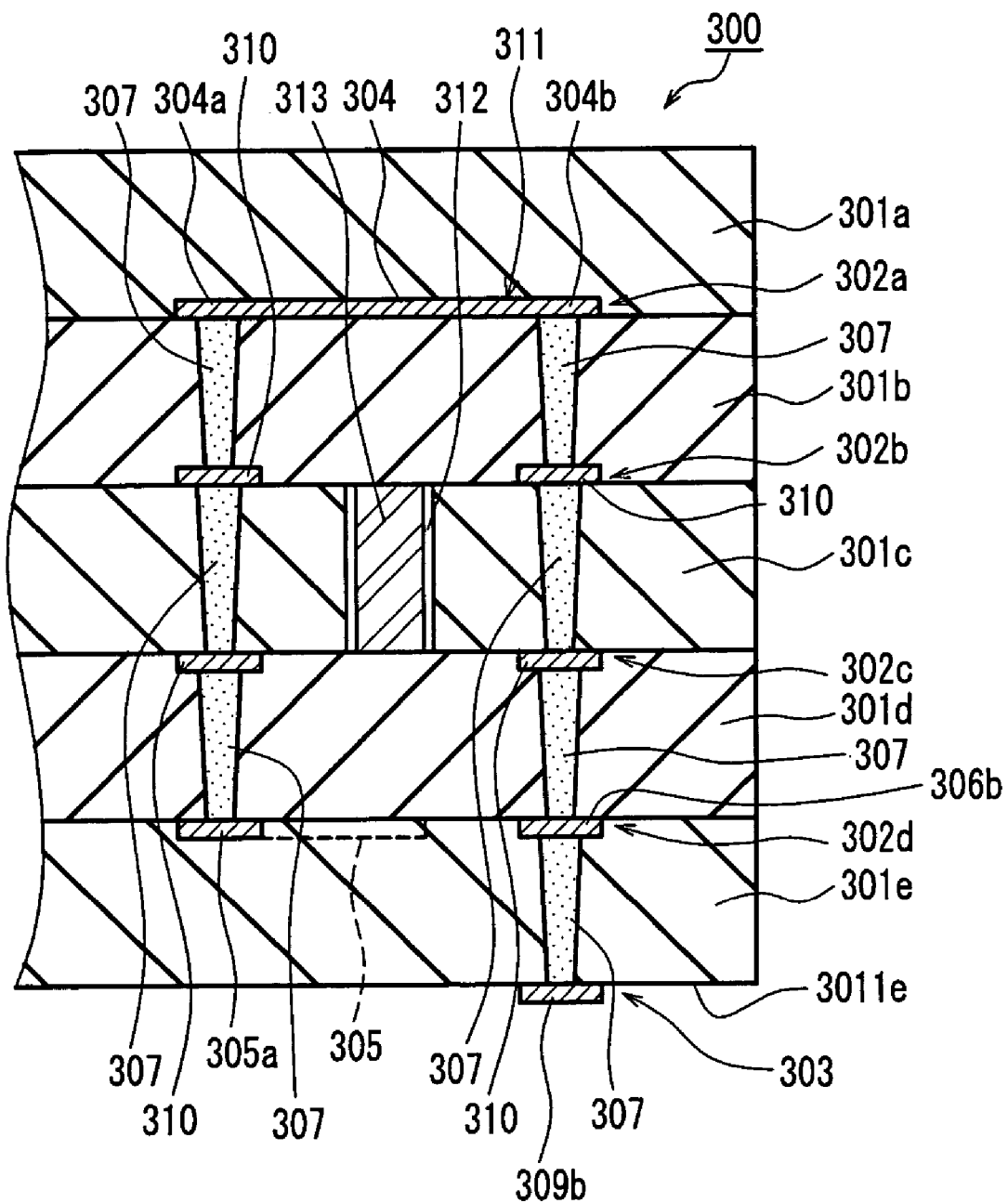
FIG. 7B is a cross-sectional view of the multilayer circuit board according to Embodiment 7 taken along the line VI-VI of FIG. 7A.

The following describes Embodiment 7 of the present invention, with reference to the drawings as needed. FIG. 7A to be referred to in the following is a perspective view of a multilayer circuit board according to Embodiment 7 of the present invention, showing each layer separately, and FIG. 7B is a cross-sectional view of the multilayer circuit board according to Embodiment 7 taken along the line VI-VI of FIG. 7A.

As shown in FIGS. 7A and 7B, a multilayer circuit board 300 according to Embodiment 7 includes: electrical insulative base members 301a to 301e; conductive patterned layers 302a to 302d provided between the respective electrical insulative base members 301a to 301e; and a conductive patterned layer 303 provided on an outer surface 3011e of the electrical insulative base member 301e.

As shown in FIG. 7A, at the conductive patterned layer 302a, a plurality of coil patterns 304 having a uniform length are disposed in a toroidal shape. At the conductive patterned layer 302d, a plurality of coil patterns 305 having a uniform length are disposed in a toroidal shape, and coil end portions 306a and 306b further are provided. The coil patterns 304 and 305 respectively have a plurality of coil pattern end portions 304a and 305a on their inner radius sides and a plurality of coil pattern end portions 304b and 305b on their outer radius sides. The coil end portion 306a is disposed on the inner radius side of the coil patterns 305, and the coil end portion 306b is disposed on the outer radius side of the coil patterns 305. Further, the coil end portion 306a and the coil pattern end portions 305a are disposed at positions right in the back of the respective corresponding coil pattern end portions 304a, and similarly the coil end portion 306b and the coil pattern end portions 305b are disposed at positions right in the back of the respective corresponding coil pattern end portions 304b. Further, at the conductive patterned layer 303, outermost layer end portions 309a and 309b are provided, which respectively are disposed at positions right in the back of the coil end portions 306a and 306b.

As shown in FIG. 7B, the respective end portions are connected electrically via a plurality of lands 310 provided at the conductive patterned layers 302b and 302c and via a plurality of conductive portions 307 formed so as to penetrate each of the electrical insulative base members 301b to 301e. Thereby, a coil 311 is formed inside the multilayer circuit board 300, the coil 311 being wound in the direction perpendicular to the thickness direction of the multilayer circuit board 300. Then, the outer shape of this coil 311 is formed in a toroidal shape. Further, inside the electrical insulative base member 301c, a toroidal-shaped groove portion 312 is provided along the inner side of the coil 311, and a toroidal-shaped magnetic member 313 is disposed within this groove portion 312. In this way, the outer shape of the coil 311 is formed in a toroidal shape and the magnetic member 313 is disposed along the inner side of the coil 311, whereby the magnetic flux generated from the coil 311 can concentrate on the inner side of the coil 311, thus further reducing the leakage of the magnetic flux. With this configuration, inductances can be obtained with accuracy, and a larger inductance can be obtained.

Embodiment 8

Figure 8:
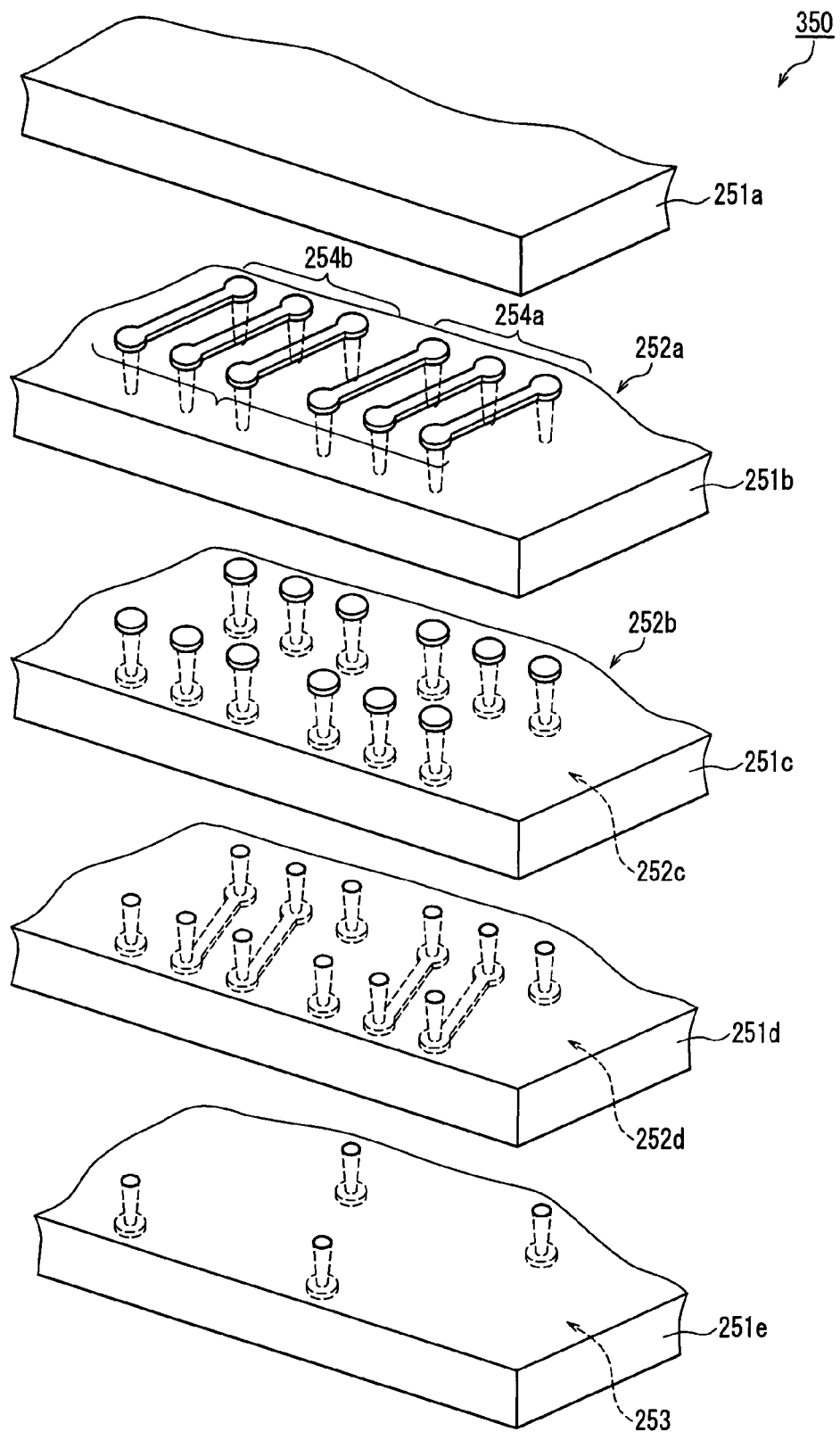
FIG. 8 is a perspective view of a multilayer circuit board according to Embodiment 8 of the present invention, showing each layer separately.
Figure 9:
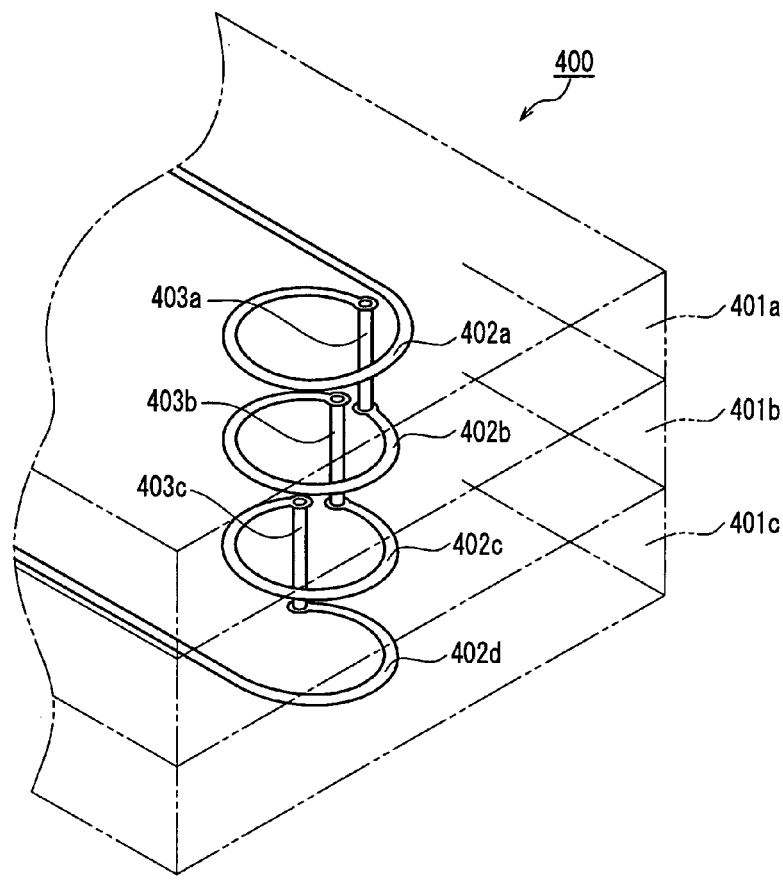
FIG. 9 is a perspective view showing a conventional patterned coil.

The following describes Embodiment 8 of the present invention, with reference to the drawings as needed. FIG. 8 to be referred to in the following is a perspective view of a multilayer circuit board according to Embodiment 8 of the present invention, showing each layer separately.

A multilayer circuit board 350 according to Embodiment 8 of the present invention is the same as the above-stated multilayer circuit board 250 of Embodiment 6 (See FIG. 6A) except that the winding number of the first coil 254a is the same as that of the winding number of the second coil 254b, and the magnetic member 256 is not provided. In the following description, the same reference numerals are assigned to the same configurations as those of Embodiment 6 and their explanations are omitted.

As shown in FIG. 8, in the multilayer circuit board 350, both of the first coil 254a and the second coil 254b are triple-wound in the direction perpendicular to the thickness direction of the multilayer circuit board 350. With this configuration, in the case where the multilayer circuit board 350 is connected with an AC power supply (not illustrated), for example, at the moment in time at which the direction of the flowing current is reversed from the first coil 254a side to the second coil 254b side (or from the second coil 254b side to the first coil 254a side), the directions of the magnetic fields formed by the currents flowing through the first coil 254a and the second coil 254b become opposite to the directions of their respective magnetic fields, and therefore noise due to the change in the magnetic flux generated from each coil can be cancelled out. As a result, each of the first coil 254a and the second coil 254b can function as a noise filter.

Note here that, in the present embodiment, a magnetic member is not disposed inside the first coil 254a and the second coil 254b. However, a magnetic member may be disposed inside the first coil 254a and the second coil 254b as in the above-stated multilayer circuit board 250 of Embodiment 6 (See FIG. 6A). Further, although the present embodiment employs a pair of coils including the first coil 254a and the second coil 254b, a circuit may be formed by arranging two or more pairs of coils parallel with each other. In this case, when connecting with an AC power supply, for example, the circuit may be configured so that the phases of the currents flowing through the respective coils forming the coil pairs can be out of phase with each other by 180 degrees. With this configuration, the respective coils can function as a noise filter similarly to the above. Alternatively, when connecting with a DC power supply, the circuit may be configured so that the polarities of the voltages applied to the respective coils forming the coil pairs are different from each other, whereby the coils can function as a noise filter similarly to the above.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A multilayer circuit board, comprising:
   two or more layers of electrical insulative base members; and
   two or more layers of conductive patterned layers, wherein each of the conductive patterned layer is disposed on at least one selected from:
   a outer surface of one of the electrical insulative base members that is an outermost layer; and
   an interface between the respective electrical insulative base members;
   wherein, at least two of the conductive patterned layers comprise coil patterns that will be a part of a coil, through holes are provided at predetermined positions of the electrical insulative base member, the positions being sandwiched between the coil patterns, so as to enable communication between respective end portions of the coil patterns;
   wherein conductive paste charged in the through holes allows electrical connection to be established between the respective end portions, whereby the coil is formed so as to be wound in a direction perpendicular to a thickness direction of the multilayer circuit board;
   wherein the electrical insulative base members contain a thermosetting resin and have been cured by application of heat and pressure; and
   wherein the two or more layers of electrical insulative base members and the two or more layers of conductive patterned layers that comprise the multilayer circuit board with the coil therein further comprise one or more components to be packaged on at least one of the two or more layers of conductive patterned layers.

2. The multilayer circuit board according to claim 1, wherein an outer shape of the coil has a toroidal shape.

3. The multilayer circuit board according to claim 1, comprising: three or more layers of the electrical insulative base members; and four or more layers of the conductive patterned layers, wherein the coil is at least double-wound continuously in the thickness direction of the multilayer circuit.

4. The multilayer circuit board according to claim 1, comprising three or more layers of the electrical insulative base members, wherein metal fails further are disposed on both principal surfaces of the multilayer circuit board so as to sandwich the coil.

5. The multilayer circuit board according to claim 1, wherein no conductive patterned layer is formed on at least one of the principal surfaces of the multilayer circuit board.

6. The multilayer circuit board according to claim 1, comprising three or more layers of the conductive patterned layers, wherein at least one of the conductive patterned layers comprises a circuit wiring, and at least a part of the circuit wiring is disposed inside the coil.

7. The multilayer circuit board according to claim 1, comprising a plurality of the coils having different winding numbers, wherein the plurality of coils are each disposed within a range enabling interaction of mutual magnetic fields.

8. The multilayer circuit board according to claim 7, further comprising a magnetic member disposed inside the plurality of coils.

9. The multilayer circuit board according to claim 1, comprising a plurality of the coils having a uniform winding number, wherein the plurality of coils are each disposed within a range enabling interaction of mutual magnetic fields.

10. The multilayer circuit board according to claim 1, comprising one or more components packaged on the two or more layers of conductive patterned layers.

11. The multilayer circuit board according to claim 10, wherein at least one of the one or more components is a capacitor.

* * * * *